US012719416B2

(12) United States Patent
Ding et al.

(10) Patent No.: US 12,719,416 B2
(45) Date of Patent: Aug. 25, 2026

(54) LOW NOISE AMPLIFICATION CIRCUIT

(71) Applicant: RadRock (Chongqing) Tech Co., Ltd., Chongqing (CN)

(72) Inventors: Tuanjie Ding, Shenzhen (CN); Nan Song, Shenzhen (CN); Jianxing Ni, Shenzhen (CN)

(73) Assignee: RadRock (Chongqing) Tech Co., Ltd., Chongqing (CN)

( * ) Notice: Subject to any disclaimer, the term of this patent is extended or adjusted under 35 U.S.C. 154(b) by 523 days.

(21) Appl. No.: 18/270,210

(22) PCT Filed: Oct. 26, 2021

(86) PCT No.: PCT/CN2021/126283
§ 371 (c)(1),
(2) Date: Jun. 29, 2023

(87) PCT Pub. No.: WO2022/142637
PCT Pub. Date: Jul. 7, 2022

(65) Prior Publication Data

US 2024/0088837 A1 Mar. 14, 2024

(30) Foreign Application Priority Data

Dec. 31, 2020 (CN) ......................... 202011637068.2

(51) Int. Cl.
*H03F 1/56* (2006.01)
*H03F 3/19* (2006.01)

(52) U.S. Cl.
CPC ............... *H03F 1/565* (2013.01); *H03F 3/19* (2013.01); *H03F 2200/294* (2013.01); *H03F 2200/387* (2013.01); *H03F 2200/451* (2013.01)

(58) Field of Classification Search
None
See application file for complete search history.

(56) References Cited

U.S. PATENT DOCUMENTS

2004/0251960 A1 12/2004 Macedo
2008/0125068 A1* 5/2008 Magnusen ........... H03G 1/0088 455/200.1

FOREIGN PATENT DOCUMENTS

CN 1534867 A 10/2004
CN 102751951 A 10/2012
(Continued)

OTHER PUBLICATIONS

International Search Report of PCT Patent Application No. PCT/CN2021/126283 issued on Jan. 26, 2022.

*Primary Examiner* — Andrea Lindgren Baltzell
*Assistant Examiner* — Malane Lieng

(57) ABSTRACT

Provided is a low noise amplification circuit, comprising: a RF amplification circuit, one end of which is connected with a signal input end, another end is connected with the output impedance matching circuit; an output impedance matching circuit, one end of which is connected with the RF amplification circuit, another end is connected with the attenuation network; an attenuation network, one end of which is connected with the output impedance matching circuit, another end is connected with a signal output end; a passive attenuation path, one end of which is connected with the signal input end, another end is connected with a connection node between the matching circuit and the network; and an impedance regulation network, configured to, in a first working mode, resonate with a parasitic capacitance generated by the network, in a second working mode, resonate with a parasitic capacitance generated by the network and the attenuation path.

10 Claims, 4 Drawing Sheets

(56) References Cited

FOREIGN PATENT DOCUMENTS

| | | | |
|---|---|---|---|
| CN | 102823129 | A | 12/2012 |
| CN | 104378074 | A | 2/2015 |
| CN | 106656071 | A | 5/2017 |
| CN | 107636975 | A | 1/2018 |
| CN | 108736835 | A | 11/2018 |
| CN | 109586756 | A | 4/2019 |
| CN | 111953311 | A | 11/2020 |

* cited by examiner

22
L21
R21
21
Adjustable capacitance unit
A
Coff1
Attenuation network
Vout
30
10
M12
C12
C11
Vin
M11
L11
C62
C61
Coff_m1
Coff_m2
Coff_m3
B
50
M41
M42
M43
L51
C51
40

LOW NOISE AMPLIFICATION CIRCUIT

This application claims the priority of China Patent Application No. 202011637068.2, filed on Dec. 31, 2020, entitled "Low noise amplification circuit", the contents of which are incorporated herein by reference in their entirety.

TECHNICAL FIELD

The application relates to the technical field of radio frequency communication, in particular to a low noise amplification circuit.

BACKGROUND

In radio frequency applications, it is necessary to amplify the transmitted or received RF signals. At the front end of the receiving link, low noise amplification circuit is usually adopted to amplify the received RF signal to improve the receiving performance. The low noise design of the receiver's front-end amplification circuit is the core that determines the performance of the whole communication system. There is impedance mismatch in the existing low noise amplification circuit during the process of amplifying the RF signal, which affects the signal quality of the amplified RF signal.

SUMMARY

The embodiments of the application provide a low noise amplification circuit, aiming to solve the problem of impedance mismatch in the signal amplification process of the low noise amplification circuit.

The present application provides a low noise amplification circuit, including a RF amplification circuit, an output impedance matching circuit, an attenuation network, a passive attenuation path and an impedance regulation network;

one end of the RF amplification circuit is connected with a signal input end, and another end is connected with the output impedance matching circuit;

one end of the output impedance matching circuit is connected with the RF amplification circuit, and another end is connected with the attenuation network;

one end of the attenuation network is connected with the output impedance matching circuit, and another end is connected with a signal output end;

one end of the passive attenuation path is connected with the signal input end, and another end is connected with a connection node between the output impedance matching circuit and the attenuation network; and the impedance regulation network is configured to, in a first working mode, resonate with a parasitic capacitance generated by the attenuation network, in a second working mode, resonate with a parasitic capacitance generated by the attenuation network and the passive attenuation path, so as to realize impedance matching.

Preferably, one end of the passive attenuation path is connected with the signal input end, and another end is connected with a connection node between the output impedance matching circuit and the attenuation network; and one end of the impedance regulation network is connected with a connection node between the passive attenuation path and the second DC blocking capacitor, and another end is connected with the ground.

Preferably, one end of the passive attenuation path is connected with the signal input end via a first DC blocking capacitor, and another end is connected with a connection node between the output impedance matching circuit and the attenuation network via a second DC blocking capacitor; and one end of the impedance regulation network is connected with a connection node between the passive attenuation path and the second DC blocking capacitor, and another end is connected with the ground.

Preferably, the impedance regulation network is an inductance regulation network.

Preferably, the inductance regulation network includes a first regulation inductor, a second regulation inductor, a first regulation switch and a second regulation switch;

one end of the first regulation inductor is connected with the passive attenuation path and the second DC blocking capacitor, and another end is connected with the second regulation inductor;

one end of the second regulation inductor is connected with the first regulation inductor, and another end is connected with the ground via the second regulation switch; and one end of the first regulation switch is connected to a connection node between the first regulation inductor and the second regulation inductor, and another end is connected to the ground.

Preferably, the inductance regulation network includes the first regulation inductor and a first adjustable capacitor arranged in parallel;

one end of the first regulation inductor is connected with the passive attenuation path and the second DC blocking capacitor, and another end is connected with the ground; and one end of the first adjustable capacitor is connected to a connecting path of the passive attenuation path and the first regulation inductor, and another end is connected to the ground.

Preferably, the output impedance matching circuit includes an adjustable capacitance unit and an impedance matching unit;

one end of the adjustable capacitance unit is connected with the RF amplification circuit, and another end is connected with the attenuation circuit; and one end of the impedance matching unit is connected with a power supply, and another end is connected with a connection node between the RF amplification circuit and the adjustable capacitance unit.

Preferably, the adjustable capacitance unit includes at least two capacitance adjustment branches arranged in parallel between the RF amplification circuit and the attenuation network;

each capacitance adjustment branch includes a capacitance selection switch and a to-be-selected adjustable capacitance, wherein a first end of the capacitance selection switch is connected with the RF amplification circuit as an input end of the adjustable capacitance unit, a second end of the capacitance selection switch is connected with a first end of the to-be-selected adjustable capacitance, and a second end of the to-be-selected adjustable capacitance is connected with the attenuation network as an output end of the adjustable capacitance unit.

Preferably, the output impedance matching circuit includes a matching inductor and a matching resistor;

one end of the matching inductor is connected with the power supply, and another end is connected with the connection node between the RF amplification circuit and the adjustable capacitance unit; and one end of the matching resistor is connected with the power supply, and another end is connected with the connection node between the RF amplification circuit and the adjustable capacitance unit.

Preferably, the passive attenuation path includes at least two disconnectors connected in series;

each disconnector includes a signal control end, a first end and a second end, the first end and the second end of two adjacent disconnectors are connected, the first end of a first disconnector is connected with the signal input end, and the second end of a last disconnector is connected with the impedance regulation network and the second DC blocking capacitor.

Preferably, the attenuation network includes at least two attenuation units, at least two unit selection switches and one attenuation selection switch; the at least two attenuation units are arranged in series between the output impedance matching circuit and the signal output end to form a series attenuation circuit; each unit selection switch is connected in parallel with one attenuation unit; and the attenuation selection switch is connected in parallel with the series attenuation circuit.

When the passive attenuation path enters the first working mode, the low noise amplification circuit utilizes the parasitic capacitance generated by the impedance regulation network and the attenuation network to generate resonance, so as to realize impedance matching of the low noise amplification circuit, and thus ensure the signal quality of the RF signal amplified by the low noise amplification circuit. When the passive attenuation path enters the second working mode, the low noise amplification circuit utilizes the parasitic capacitance generated by the impedance regulation network and the attenuation network to generate resonance, and can also resonate with the parasitic capacitance generated by the passive attenuation path, so as to realize impedance matching of the low noise amplification circuit.

BRIEF DESCRIPTION OF THE DRAWINGS

In order to explain the technical solution of the embodiments of this application more clearly, the drawings described in the description of the embodiments of this application will be briefly introduced below. Obviously, the drawings in the present application and their accompanying detailed description are directed to merely exemplary embodiments of the application. For those of ordinary skill in this field, other drawings may be obtained according to these drawings without any creative effort.

DETAILED DESCRIPTION OF PREFERRED EMBODIMENTS

Figure 1:
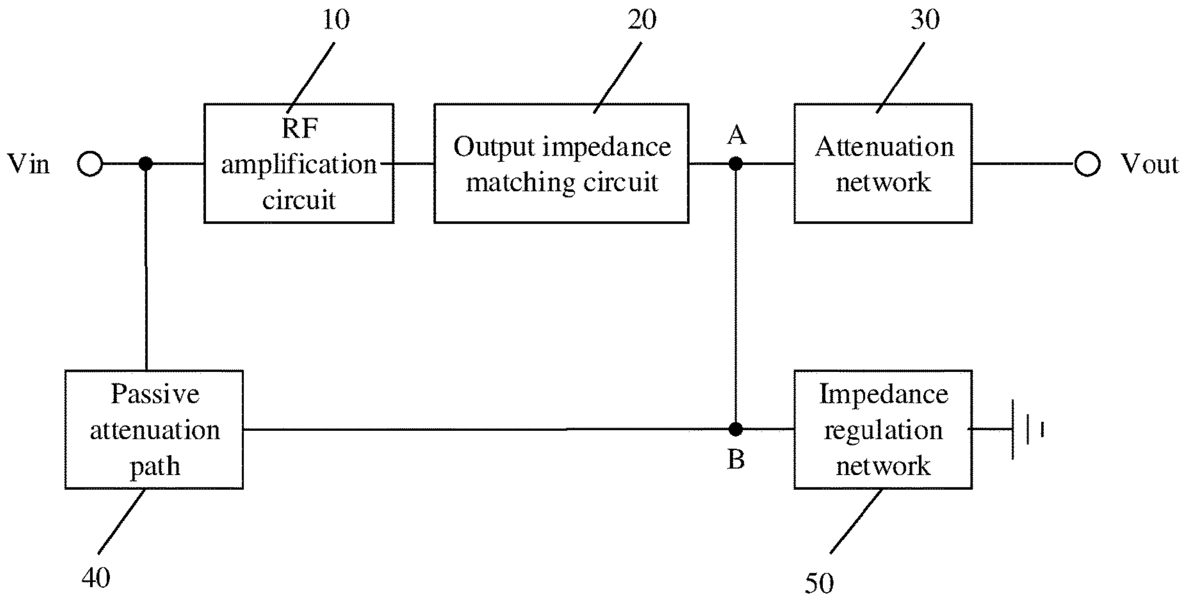
FIG. 1 is a schematic circuit diagram of a low noise amplification circuit according to an embodiment of the present application.

The technical solutions in the embodiments of the present application will be clearly and completely described below with reference to the drawings in the embodiments of this application. Obviously, the described embodiments are part of the embodiments of this application, but not all of them. Based on the embodiments in this application, all other embodiments obtained by those of ordinary skill in the art without creative effort belong to the protection scope of this application.

It should be understood that the exemplary embodiments may be embodied in many different forms and should not be construed as being limited to the exemplary embodiments set forth herein. Rather, these embodiments are provided so that this disclosure will be thorough and complete, and will fully convey the protection scope of this application to those skilled in the art. In the drawings, like reference signs refer to like elements throughout, and the size and relative sizes of layers and regions may be exaggerated for clarity.

It should be understood that when an element or layer is referred to as being "on", "adjacent to", "connected with" or "coupled to" other elements or layers, it may be directly on, adjacent to, connected with or coupled to other elements or layers, or intervening elements or layers. Rather, when an element is referred to as being "directly on", "directly adjacent to", "directly connected with" or "directly coupled to" other elements or layers, there is no intervening element or layer. It should be understood that although the terms first, second, third, etc. are used to describe various elements, components, areas, layers and/or parts, these elements, components, areas, layers and/or parts should not be limited by these terms. These terms are only used to distinguish one element, part, area, layer or part from another element, part, area, layer or part. Therefore, without departing from the teachings of this application, the first element, part, area, layer or part discussed below may be represented as the second element, part, area, layer or part.

Spatial terms such as "below", "under", "above" and "on" may be used here for convenience of description to describe the relationship between one element or feature and other elements or features shown in the figures. It should be understood that in addition to the orientations shown in the figures, the spatial relationship terms are intended to include different orientations of devices in use and operation. For example, if the device in the figures is turned upside down, then the elements or features described as "below" or "under" other elements or features would be "above" or "on" other elements or features. Therefore, the exemplary terms "below" or "under" may include the orientations of "above" or "on". The device may be otherwise oriented (rotated by 90 degrees or other orientations) and the spatial description terms used here are interpreted accordingly.

The terms used here are only for the purpose of describing specific embodiments and not as a limitation of the present application. As used herein, singular forms of "a", "an" and "the/said" are also intended to include plural forms, unless the context clearly indicates otherwise. It should also be understood that the terms "include" and/or "include" used in this specification specify the presence of said features, integers, steps, operations, elements and/or components, but do not exclude the presence or addition of one or more other features, integers, steps, operations, elements, components and/or groups. As used herein, the term "and/or" includes any and all combinations of related listed items.

For a thorough understanding of this application, detailed structures and steps will be set forth in the following description, so as to illustrate the technical solution proposed in the present application. The preferred embodiments of the present application are described in detail as follows, but besides these detailed descriptions, the present application may also have other embodiments.

The embodiment of the application provides a low-noise amplification circuit. As shown in FIG. 1, the low noise amplification circuit includes a RF amplification circuit 10, an output impedance matching circuit 20, an attenuation network 30, a passive attenuation path 40 and an impedance regulation network 50; one end of the RF amplification circuit 10 is connected with a signal input end, and another end is connected with the output impedance matching circuit 20; one end of the output impedance matching circuit 20 is connected with the RF amplification circuit 10, and another end is connected with the attenuation network 30; one end of the attenuation network 30 is connected with the output impedance matching circuit 20, and another end is connected with a signal output end; one end of the passive attenuation path 40 is connected with the signal input end, and another end is connected with a connection node between the output impedance matching circuit 20 and the attenuation network 30; and the impedance regulation network 50 is configured to, in a first working mode, resonate with a parasitic capacitance generated by the attenuation network 30, in a second working mode, resonate with a parasitic capacitance generated by the attenuation network 30 and the passive attenuation path 40, so as to realize impedance matching.

Furthermore, an input impedance matching circuit is usually connected to the signal input end of the low noise amplification circuit, and the input impedance matching circuit is preferably to be an input matching inductor, so as to realize the input impedance matching of the low noise amplification circuit and ensure the quality of the input signal input to the RF amplification circuit or the passive attenuation path.

The RF amplification circuit 10 is a circuit for amplifying radio frequency signals.

The attenuation network 30 is a circuit for attenuating radio frequency signals. In this embodiment, the attenuation network 30 may be a network formed by a plurality of transistors and a plurality of resistors in series and/or in parallel, which can realize signal attenuation processing.

The output impedance matching circuit 20 is a circuit arranged between the RF amplification circuit 10 and the attenuation network 30, used for realizing impedance matching. In this embodiment, the output impedance matching circuit 20 includes a capacitive element and an inductive element, and the capacitance value of the capacitive element is adjustable. By adjusting the capacitance value of the output impedance matching circuit 20, the impedance matching between the RF amplification circuit 10 and the attenuation network 30 is realized.

The impedance regulation network 50 is a network used for realizing impedance matching regulation.

The passive attenuation path 40 is a switching circuit arranged between the signal input end Vin and the attenuation network 30. In this embodiment, the first working mode refers to a working mode that aims to amplify the RF signal input from the signal input end Vin. Specifically, the passive attenuation path 40 can be controlled to be disconnected, so that the RF signal can be amplified by the RF amplifier circuit 10, impedance matched by the output impedance matching circuit 20 and attenuated by the attenuation network 30. Accordingly, the second working mode refers to a working mode that does not aim to amplify the RF signal input from the signal input end Vin. Specifically, the passive attenuation path 40 can be controlled to be disconnected, so that the RF signal can be directly input into the attenuation network 30 for attenuation processing after passing through the passive attenuation path 40, so that whether the input RF signal needs to be amplified can be independently determined according to the actual situation.

As an embodiment, when it needs to amplify the RF signal input from the signal input end Vin, the passive attenuation path 40 can be disconnected to enter the first working mode, so that the RF signal may be amplified by the RF amplification circuit 10, impedance matched by the output impedance matching circuit 20 and attenuated by the attenuation network 30. In this state, the RF signal input from the signal input end Vin is amplified by the RF amplification circuit 10, impedance matched by the output impedance matching circuit 20 and then proceed to the attenuation network 30. In an ideal state, connection node A between the output impedance matching circuit 20 and the attenuation network 30 should normally achieve impedance matching of 50Ω. However, the attenuation amount of the attenuation network 30 is determined by transistors, the attenuation network 30 would inevitably generate parasitic capacitance Coff1, which would lead to impedance mismatch in the connection node A between the output impedance matching circuit 20 and the attenuation network 30, showing capacitive impedance. Therefore, it is necessary to arrange an impedance regulation network 50, which may be a regulation network with one end connected to the connection node A between the output impedance matching circuit 20 and the attenuation network 30, and the other end connected to the ground, and can resonate with the parasitic capacitance Coff1 generated by the attenuation network 30, thus realizing the impedance matching of the low noise amplification circuit.

In another embodiment, when it does not need to amplify the RF signal input from the signal input end Vin, the passive attenuation path 40 can be disconnected to enter the second working mode, so that the RF signal may be directly input into the attenuation network 30 for attenuation processing after passing through the passive attenuation path 40. In this state, one end of the passive attenuation path 40 is connected with the signal input end Vin, and the other end is connected with the connection node between the output impedance matching circuit 20 and the attenuation network 30. Understandably, when the passive attenuation path 40 is connected, that is, when the RF signal is directly input into the attenuation network 30 through the passive attenuation path 40 for attenuation processing, in an ideal state, connection node B between the passive attenuation path 40 and the attenuation network 30 should generally have an actual impedance matching of 50Ω. However, the attenuation amount of the attenuation network 30 is determined by transistors, the attenuation network 30 would inevitably generate a parasitic capacitance Coff1, and the transistor in the passive attenuation path 40 would inevitably generate parasitic capacitance Coff2, which would lead to impedance mismatch in the connection node B between the passive attenuation path 40 and the attenuation network 30, showing capacitive impedance. Therefore, it is necessary to arrange an impedance regulation network 50, which can be a regulation network with one end connected not only to the connection node A between the output impedance matching circuit 20 and the attenuation network 30, but also to the connection node B between the passive attenuation path 40 and the attenuation network 30, and the other end connected to the ground. It can not only resonate with the parasitic capacitance Coff1 generated by the attenuation network 30, but also resonate with the parasitic capacitance Coff2 generated by the passive attenuation path 40, thus realizing the low noise amplification circuit.

In the low noise amplification circuit provided by this embodiment, when entering the first working mode, the parasitic capacitance generated by the impedance regulation network 50 and the attenuation network 30 is used to generate resonance, so as to realize the impedance matching of the low noise amplification circuit, hence ensuring the signal quality of the RF signal amplified by the low noise amplification circuit; when entering the second operation mode, the parasitic capacitance Coff1 generated by the impedance regulation network 50 and the attenuation network 30 is used to generate resonance, and the low noise amplification circuit can also resonate with the parasitic capacitance Coff2 generated by the passive attenuation path 40, thus realizing the impedance matching of the low noise amplification circuit.

In an embodiment, one end of the passive attenuation path 40 is connected with the signal input end, and another end is connected with a connection node between the output impedance matching circuit 20 and the attenuation network 30; and one end of the impedance regulation network 50 is connected with the passive attenuation path 40 and the connection node between the output impedance matching circuit 20 and the attenuation network 30, and another end is connected with a ground.

In another embodiment, one end of the passive attenuation path 40 is connected to the signal input end via a first DC blocking capacitor C61, and another end is connected to a connection node between the output impedance matching circuit 20 and the attenuation network 30 via a second DC blocking capacitor C62; one end of the impedance regulation network 50 is connected to a connection node between the passive attenuation path 40 and the second DC blocking capacitor C62, and another end is connected to the ground.

Figure 2:
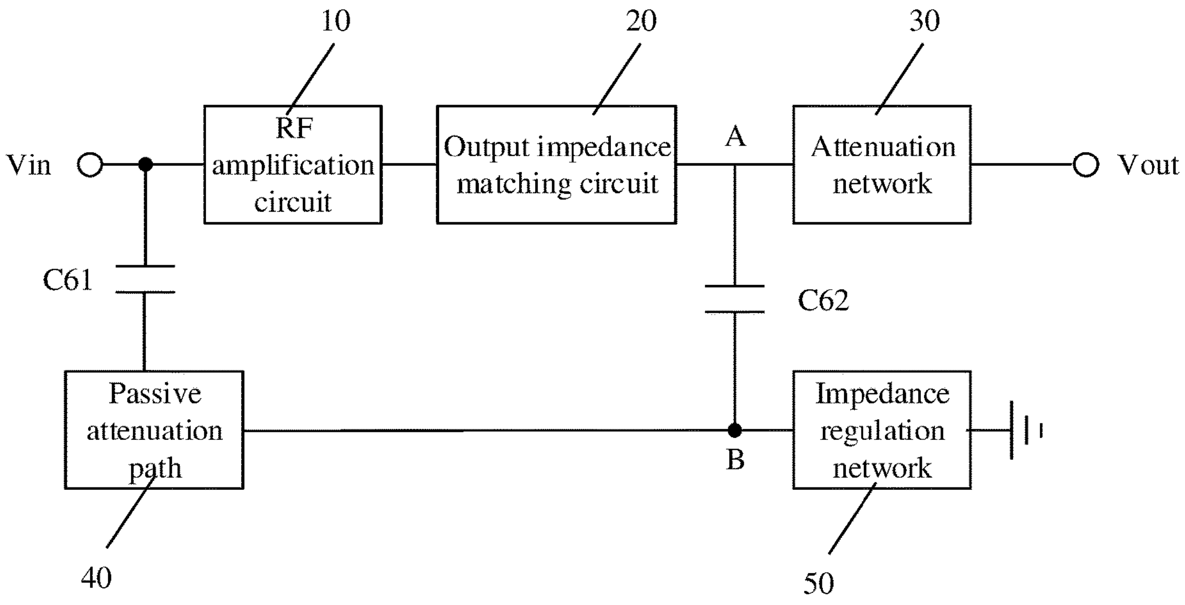
FIG. 2 is a schematic circuit diagram of a low noise amplification circuit according to an embodiment of the present application.
Figure 3:
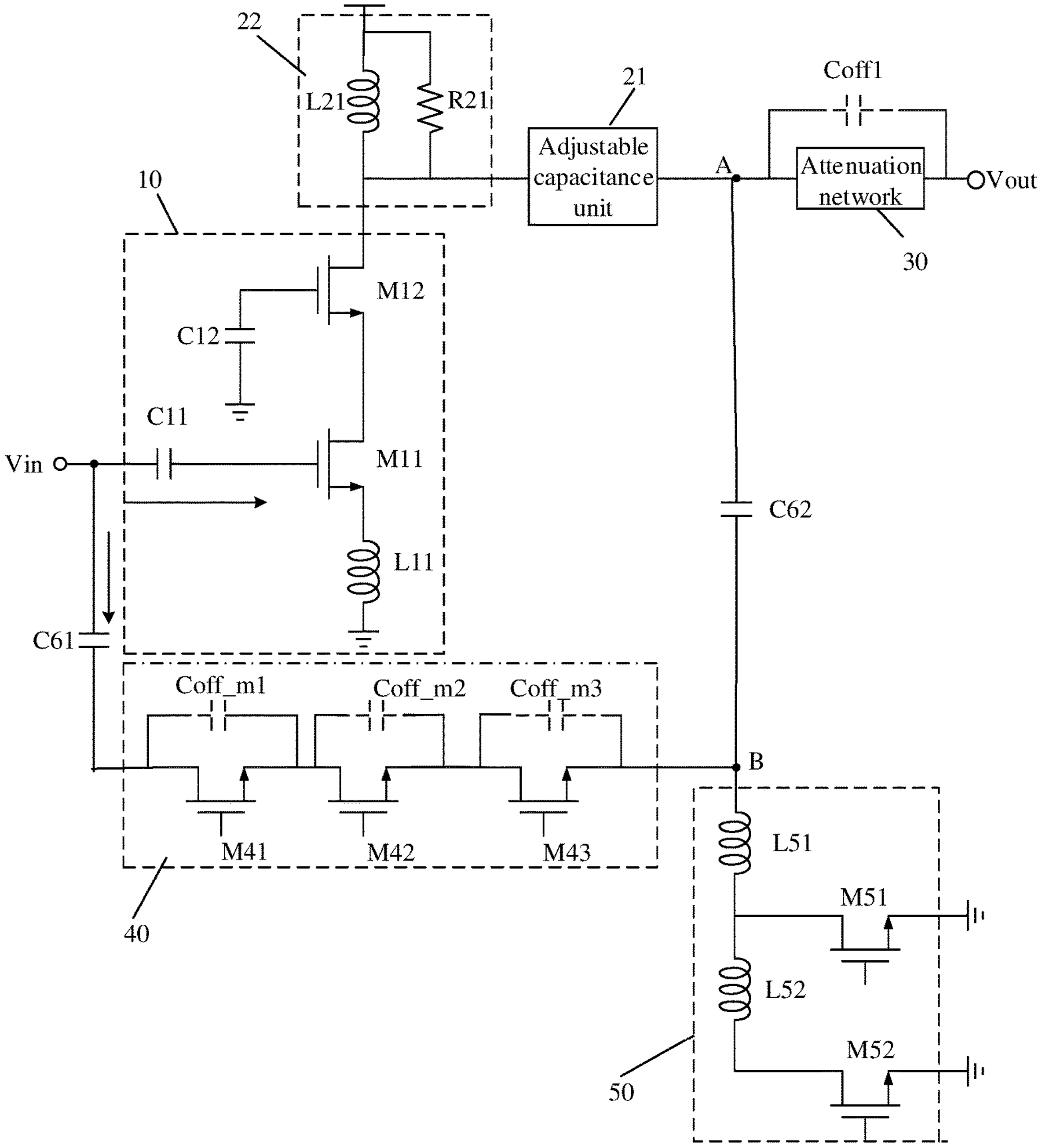
FIG. 3 is a schematic circuit diagram of a low noise amplification circuit according to an embodiment of the present application.
Figure 4:
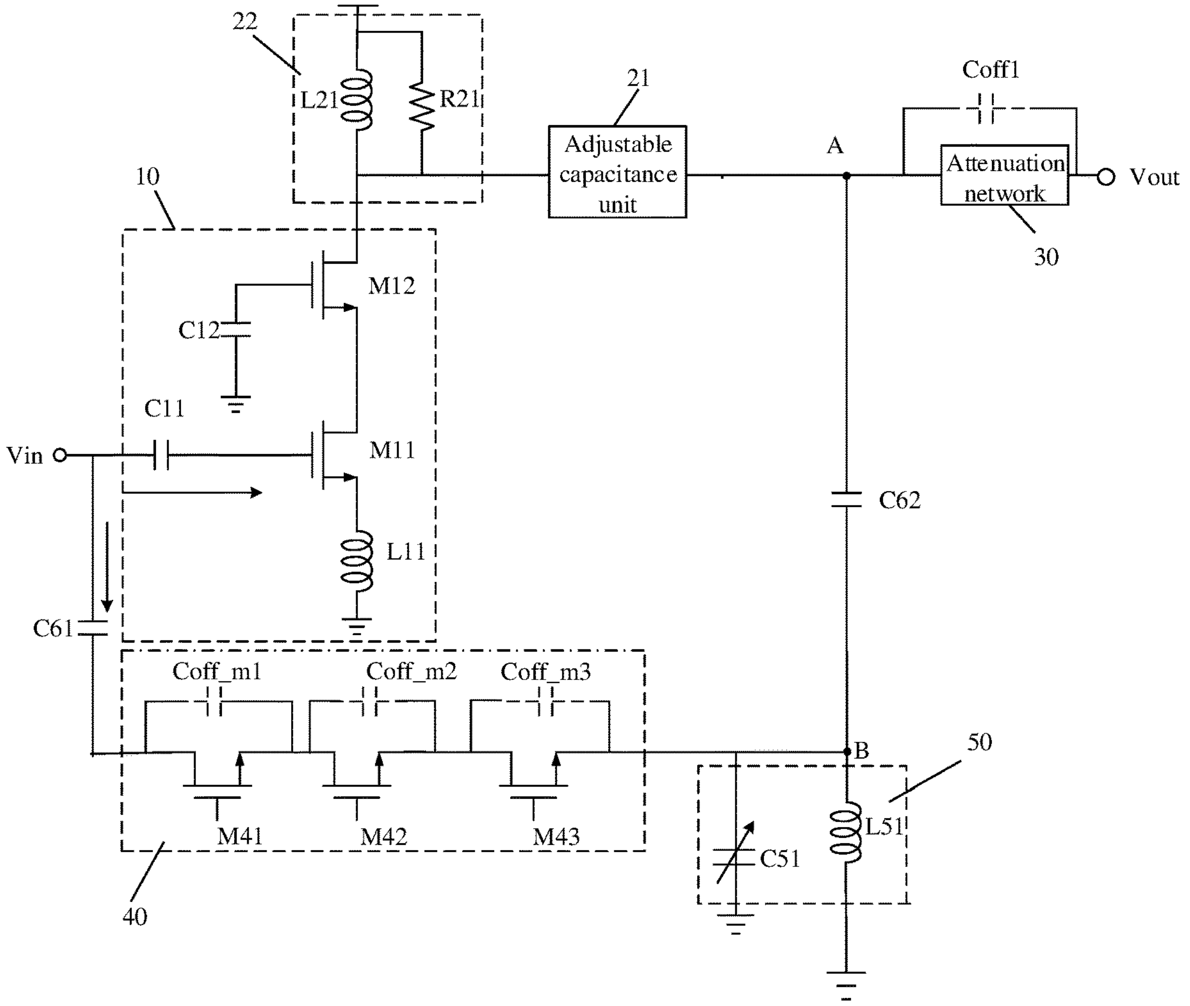
FIG. 4 is a schematic circuit diagram of a low noise amplification circuit according to an embodiment of the present application.

As shown in FIG. 2-FIG. 4, the low noise amplification circuit further includes a first DC blocking capacitor C61 and a second DC blocking capacitor C62; one end of the first DC blocking capacitor C61 is connected to the signal input end Vin, and another end is connected to the passive attenuation path 40; one end of the second DC blocking capacitor C62 is connected to the passive attenuation path 40, and another end is connected to a connection node between the adjustable capacitance unit 21 and the attenuation network 30. With the DC blocking characteristics of the first DC blocking capacitor C61 and the second DC blocking capacitor C62, DC is blocked and only RF signals are allowed to pass, thus ensuring the signal quality of the amplified RF signals.

In this embodiment, one end of the impedance regulation network 50 is connected to a connection node between the passive attenuation path 40 and the second DC blocking capacitor C62, and another end is connected to the ground, which can achieve resonance with the parasitic capacitance generated by the attenuation network 30 when the passive attenuation path 40 is switched to the first working mode, and resonance with the parasitic capacitance generated by the attenuation network 30 and the passive attenuation path 40 in the second working mode, so as to realize impedance matching. Specifically, when the passive attenuation path 40 is disconnected and in the first working mode, one end of the second DC blocking capacitor C62 is connected to the passive attenuation path 40, and another end is connected to the connection node between the adjustable capacitance unit 21 and the attenuation network 30, while one end of the impedance regulation network 50 is connected to the connection node between the passive attenuation path 40 and the second DC blocking capacitor C62, and another end is connected to the ground, which can resonate with the parasitic capacitance formed by the attenuation network, so as to realize impedance matching. Accordingly, one end of the second DC blocking capacitor C62 is connected to the passive attenuation path 40, and another end is connected to the connection node between the adjustable capacitance unit 21 and the attenuation network 30, while one end of the impedance regulation network 50 is connected to the connection node between the passive attenuation path 40 and the second DC blocking capacitor C62, and another end is connected to the ground, so that the impedance regulation network 50 can resonate not only with the parasitic capacitor Coff1 generated by the attenuation network 30, but also with the parasitic capacitor Coff2 generated by the passive attenuation path 40, thus realizing impedance matching of the low noise amplification circuit.

In one embodiment, the impedance regulation network 50 is an inductance regulation network.

And the inductance regulation network is a regulation network containing an inductance element. In this embodiment, because the attenuation network 30 is composed of transistors and other components, and the passive attenuation path 40 is also composed of transistors and other components, the attenuation network 30 would inevitably produce parasitic capacitance Coff1 during the working process, while the passive attenuation path 40 would inevitably produce parasitic capacitance Coff2 during the working process, and the low noise amplification circuit would show capacitive impedance. In order to offset the capacitive impedance exiting in the low-noise amplifier circuit, an inductance regulation network containing an inductance element may be adopted to resonate with the capacitive impedance.

In an embodiment, as shown in FIG. 3, the inductance regulation network includes a first regulation inductor L51, a second regulation inductor L52, a first regulation switch M51 and a second regulation switch M52. One end of the first regulation inductor L51 is connected to the connection node between the passive attenuation path 40 and the second DC blocking capacitor C62, and another end is connected to the second regulation inductor L52. One end of the second regulation inductor L52 is connected with the first regulation inductor L51, and another end is connected with the ground via the second regulation switch M52. One end of the first regulation switch M51 is connected to the connection node between the first regulation inductor L51 and the second regulation inductor L52, and another end is connected to the ground.

As an example, one end of the inductance regulation network is connected to the connection node between the passive attenuation path 40 and the second DC blocking capacitor C62, and another end is connected to the ground. Therefore, one of the first regulation inductor L51 and the second regulation inductor L52 connected in series needs to be connected to the connection node between the passive attenuation path 40 and the second DC blocking capacitor C62, and the other is connected to the ground. In this example, one end of the first regulation inductor L51 is connected to the connection node between the passive attenuation path 40 and the second DC blocking capacitor C62, and another end is connected to the second regulation inductor L52. And the second regulation inductor L52 is connected to the ground via the second regulation switch M52, and the connection node between the first regulation inductor L51 and the second regulation inductor L52 is connected to the ground via the first regulation switch M51.

Generally, the greater the inductance value in parallel connection in the circuit, the smaller the parasitic capacitance in parallel connection may be offset. Therefore, when the RF signal is processed through the RF amplifier circuit 10, the output impedance matching circuit 20 and the attenuation network 30, the parasitic capacitance to be counteracted is Coff1. In this state, the first regulation switch M51 needs to be disconnected and the second regulation switch M52 is connected, so that the first regulation inductor L51 and the second regulation inductor L52 are grounded via the second regulation switch M52 after being connected in series. In this way, the first regulation inductor L51 and the second regulation inductor L52 cooperate to form a larger inductance value, which resonates with the parasitic capacitor Coff1 to realize impedance matching. When the RF signal is directly input into the attenuation network 30 through the passive attenuation path 40 for processing, the parasitic capacitance to be counteracted is Coff1+Coff2. In this state, the first regulation switch M51 needs to be connected and the second regulation switch M52 is disconnected, so that the first regulation inductor L51 is grounded via the first regulation switch M51. In this way, the smaller inductance value formed by the first regulation inductor L51 resonates with the parasitic capacitance Coff1+Coff2 to achieve impedance matching.

In an embodiment, as shown in FIG. 4, the inductance regulation network includes a first regulation inductor L51 and a first adjustable capacitor C51 arranged in parallel. One end of the first regulation inductor L51 is connected to the connection node between the passive attenuation path 40 and the second DC blocking capacitor C62, and another end is connected to the ground. One end of the first adjustable capacitor C51 is connected to the connecting path between the passive attenuation path 40 and the first regulation inductor L51, and another end is connected to the ground.

Wherein, the inductance regulation network includes a first regulation inductor L51 and a first adjustable capacitor C51 which are arranged in parallel, and the first adjustable capacitor C51 refers to a capacitor with an adjustable capacitance value. In this example, in the low noise amplification circuit, one end of the first regulation inductor L51 is connected to the connection node between the passive attenuation path 40 and the second DC blocking capacitor C62, and another end is connected to the ground. One end of the first adjustable capacitor C51 is connected to the connecting path between the passive attenuation path 40 and the first regulation inductor L51, and another end is connected to the ground, so that the capacitance value of the first adjustable capacitor C51 can be adjusted independently according to the actual situation to realize impedance matching.

Generally, the larger the inductance value in parallel in the circuit, the smaller the parasitic capacitance it can offset. Therefore, when the RF signal is processed by the RF amplification circuit 10, the output impedance matching circuit 20 and the attenuation network 30, the parasitic capacitance to be counteracted is Coff1. In this state, the capacitance value of the first adjustable capacitor C51 needs to be lower, so that the inductance regulation network would have a larger inductance value and resonate with the parasitic capacitance Coff1 to achieve impedance matching. When the RF signal is directly input into the attenuation network 30 through the passive attenuation path 40 for processing, the parasitic capacitance to be counteracted is Coff1+Coff2. In this state, the first adjustable capacitor C51 is expected to increase its capacitance value, so that the inductance regulation network would have a smaller inductance value and resonate with the parasitic capacitance Coff1+Coff2 to achieve impedance matching.

In an embodiment, as shown in FIGS. 3 and 4, the RF amplification circuit 10 includes a first amplification transistor M11, a second amplification transistor M12, an input DC blocking capacitor C11, a RF ground capacitor C12 and a gain regulation inductor L11. The signal control end of the first amplification transistor M11 is connected with the signal input end Vin via the input DC blocking capacitor C11, and the first end of the first amplification transistor M11 is connected with the second end of the second amplification transistor M12, the second end of the first amplification transistor M11 is connected to the ground via the gain regulation inductor L11, the signal control end of the second amplification transistor M12 is connected to the ground via the RF ground capacitor C12, and the first end of the second amplification transistor M12 is connected to the output impedance matching circuit 20.

In this example, the RF signal input from the signal input end Vin is sent to the first amplification transistor M11 via the input DC blocking capacitor C11, and the RF signal is coupled to the first amplification transistor M11 by adopting the DC blocking features of the input DC blocking capacitor C11. The RF signal is amplified by the first amplification transistor M11 and the second amplification transistor M12. And in the amplification process of the first amplification transistor M11 and the second amplification transistor M12, the RF ground capacitor C12 is used to connect with the signal control end of the second amplification transistor M12 and the ground, so as to achieve the effect of RF grounding; and the gain regulation inductor L11 is used to connect with the second end of the first amplification transistor M11 and the ground, so as to achieve the gain regulation effect, thus ensuring the signal quality of the amplified RF signal. The first end of the second amplification transistor M12 is connected to the output impedance matching circuit 20, and the amplified RF signal may be output to the output impedance matching circuit 20, and then output to the attenuation network 30 for attenuation after impedance matching by the output impedance matching circuit 20.

As an example, the first amplification transistor M11 and the second amplification transistor M12 may be triodes, the signal control end is the base of the triode, the first end is the collector of the triode, and the second end is the emitter of the triode. Triode may be selected as amplification transistor according to actual demand.

As another example, the first amplification transistor M11 and the second amplification transistor M12 may be MOS transistors, the signal control end is the gate of the MOS transistor, the first end is the drain of the MOS transistor, and the second end is the source of the MOS transistor. MOS transistor may be selected as amplification transistor according to actual demand.

In an embodiment, as shown in FIGS. 3 and 4, the output impedance matching circuit 20 includes an adjustable capacitance unit 21 and an impedance matching unit 22. One end of the adjustable capacitance unit 21 is connected with the RF amplification circuit 10, and another end of is connected with the attenuation network 30; one end of the impedance matching unit 22 is connected to the power supply end, and another end is connected to the connection node between the RF amplification circuit 10 and the adjustable capacitance unit 21.

In an embodiment, the output impedance matching circuit 20 includes an adjustable capacitance unit 21 and an impedance matching unit 22. The adjustable capacitance unit 21 is used to connect the RF amplification circuit 10 and the attenuation network 30 to adjust the capacitance value between the RF amplification circuit 10 and the attenuation network 30, so as to cooperate with the impedance matching unit 22 to realize impedance matching. One end of the impedance matching unit 22 is connected to the power supply end, and another end is connected to the RF amplification circuit 10 and the adjustable capacitance unit 21, so that the impedance matching unit 22 is connected in parallel with the adjustable capacitance unit 21 and cooperate with the adjustable capacitance unit 21 to realize impedance matching.

Figure 5:
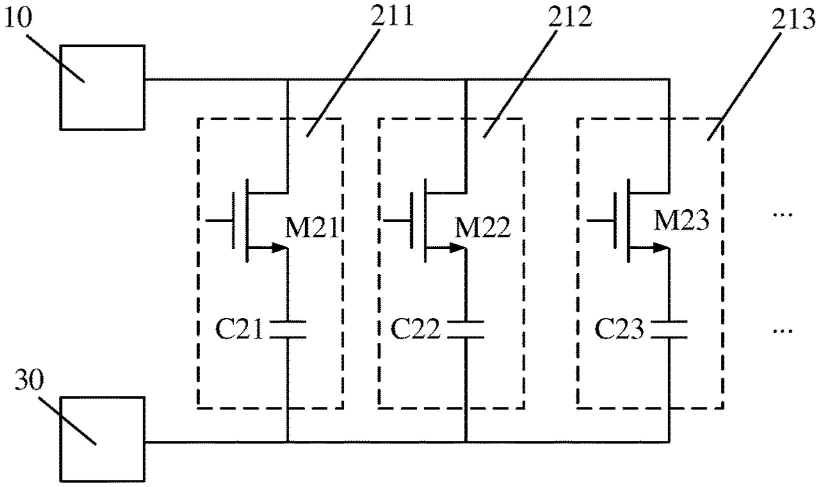
FIG. 5 is a circuit diagram of an output impedance matching circuit according to an embodiment of the present application.

In an embodiment, as shown in FIG. 5, the adjustable capacitance unit 21 includes at least two capacitance adjustment branches 211/212/213 arranged in parallel between the RF amplification circuit 10 and the attenuation network 30. Each capacitance adjustment branch 211/212/213 includes a capacitance selection switch M21/M22/M23 and a to-be-selected adjustable capacitance C21/C22/C23. The first end of the capacitance selection switch M21/M22/M23, as the input end of the adjustable capacitance unit 21, is connected to the RF amplification circuit 10. The second end of the to-be-selected adjustable capacitance C21/C22/C23, as the output end of the adjustable capacitance unit 21, is connected to the attenuation network 30.

In this example, the adjustable capacitance unit 21 includes at least two capacitance adjustment branches 211/212/213 arranged in parallel between the RF amplification circuit 10 and the attenuation network 30, each capacitance adjustment branch 211/212/213 corresponds to a different capacitance value, and the capacitance adjustment branch 211/212/213 connected between the RF amplification circuit 10 and the attenuation network 30 may be determined according to the selection, so as to determine the capacitance value between the RF amplification circuit 10 and the attenuation network 30.

In this example, each capacitance adjustment branch 211/212/213 includes a capacitance selection switch M21/M22/M23 and a to-be-selected adjustable capacitance C21/C22/C23 connected in series, and each capacitance selection switch M21/M22/M23 includes a signal control end, a first end and a second end. And the first end of each capacitance selection switch M21/M22/M23, as the input end of the adjustable capacitance unit 21, is connected to the RF amplification circuit 10, the second end is connected to the corresponding to-be-selected adjustable capacitance C21/C22/C23, and the second end of the to-be-selected adjustable capacitance C21/C22/C23, as the output end of the adjustable capacitance unit 21, is connected to the attenuation network 30. According to the control signal received by the signal control end of the capacitance selection switch M21/M22/M23, the connection and disconnection of the capacitance selection switch M21/M22/M23 can be controlled, so as to determine that the specific to-be-selected adjustable capacitance C21/C22/C23 is connected between the RF amplification circuit 10 and the attenuation network 30, thereby achieving the purpose of adjusting the capacitance value between the RF amplification circuit 10 and the attenuation network 30.

As an example, the capacitance selection switch M21/M22/M23 may be triodes, the signal control end is the base of the triode, the first end is the collector of the triode, and the second end is the emitter of the triode. Triode may be selected as the capacitance selection switch M21/M22/M23 according to actual requirements.

As another example, the capacitance selection switch M21/M22/M23 may be MOS transistors, the signal control end is the gate of the MOS transistor, the first end is the drain of the MOS transistor, and the second end is the source of the MOS transistor. MOS transistor may be selected as the capacitance selection switch M21/M22/M23 according to actual needs.

In an embodiment, as shown in FIGS. 3 and 4, the impedance matching unit 22 includes a matching inductor L21 and a matching resistor R21. One end of the matching inductor L21 is connected to the power supply, and another end is connected to the connection node between the RF amplification circuit 10 and the adjustable capacitance unit 21. One end of the matching resistor R21 is connected to the power supply, and another end is connected to the connection node between the RF amplification circuit 10 and the adjustable capacitance unit 21. The matching inductor L21 and the matching resistor R21 cooperate to realize impedance matching.

In an embodiment, as shown in FIGS. 3 and 4, the passive attenuation path 40 includes at least two disconnectors M41/M42/M43 connected in series. Each disconnector M41/M42/M43 includes a signal control end, a first end and a second end. The first and second ends of two adjacent disconnectors M41/M42/M43 are connected, and the first end of the first disconnector M41 is connected to the signal input end Vin, and the second end of the last disconnector M43 is connected to the connection node between the impedance regulation network 50 and the second DC blocking capacitor C62.

In this example, the passive attenuation path 40 is formed by connecting at least two disconnectors M41/M42/M43 in series, which can improve the blocking of the circuit, prevent the interference of RF signals, and ensure the signal quality of the transmitted RF signals. Understandably, the passive attenuation path 40 includes at least two disconnectors M41/M42/M43 connected in series, and each disconnector M41/M42/M43 would generate a parasitic capacitance Coff_mi in the working process. That is, the parasitic capacitance Coff2 generated by the passive attenuation path 40 is the sum of the parasitic capacitances Coff_mi corresponding to at least two disconnectors M41/M42/M43. In the examples shown in FIGS. 3 and 4, the parasitic capacitance is Coff2=Coff_m1+Coff_m2+Coff_m3.

As an example, the disconnectors M21/M42/M43 may be triodes, the signal control end is the base of the triode, the first end is the collector of the triode, and the second end is the emitter of the triode. Triode may be selected as the disconnector M21/M42/M23 according to actual requirements.

As another example, the disconnectors M21/M42/M43 may be MOS transistors, the signal control end is the gate of the MOS transistor, the first end is the drain of the MOS transistor, and the second end is the source of the MOS transistor. MOS transistor may be selected as the disconnector M21/M42/M23 according to actual needs.

Figure 6:
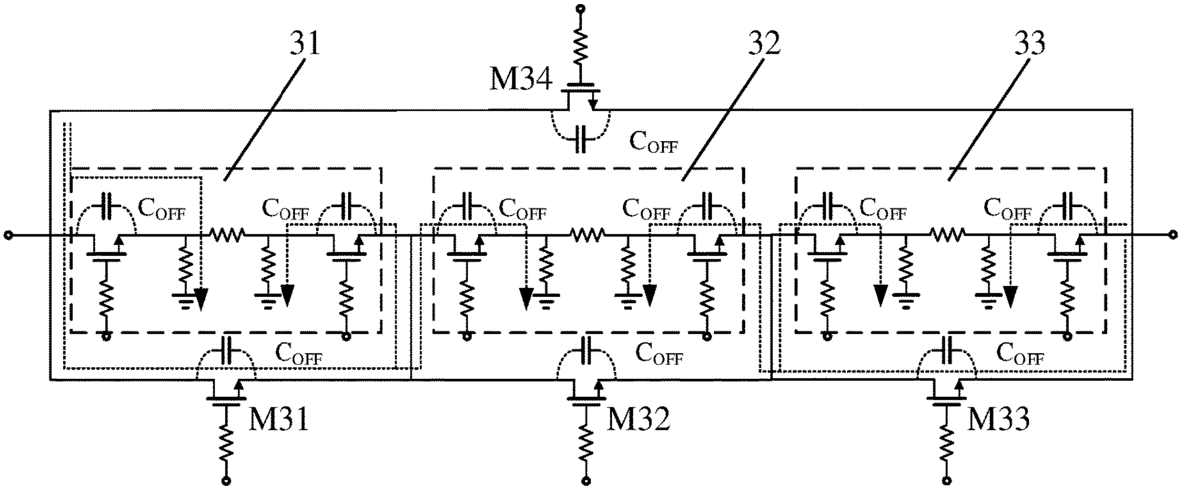
FIG. 6 is a schematic circuit diagram of an attenuation network according to an embodiment of the present application.

In an embodiment, as shown in FIG. 6, the attenuation network 30 includes at least two attenuation units 31/32/33, at least two unit selection switches M31/M32/M33 and an attenuation selection switch M34. At least two attenuation units 31/32/33 are arranged in series between the adjustable capacitance unit 21 and the signal output end Vout to form a series attenuation circuit. Each unit selection switch M31/M32/M33 is connected in parallel with an attenuation unit 31/32/33. The attenuation selection switch M34 is connected in parallel with the series attenuation circuit.

The attenuation unit 31/32/33 refers to the basic unit that can realize signal attenuation. In this example, the attenuation network 30 includes at least two attenuation units 31/32/33, and the at least two attenuation units 31/32/33 are arranged in series between the adjustable capacitance unit 21 and the signal output end Vout to form a series attenuation circuit. Generally, the attenuation frequencies of at least two attenuation units 31/32/33 in a series attenuation circuit may be the same or different, and may be set separately according to actual requirements.

The unit selection switch M31/M32/M33 refers to a switch arranged in parallel with the attenuation unit 31/32/33, and is used to determine whether the corresponding attenuation unit 31/32/33 is needed to attenuate the RF signal. For example, when a certain attenuation unit 31/32/33 is adopted to attenuate the RF signal, the unit selection switch M31/M32/M33 may be controlled to disconnect, so that the RF signal is attenuated by the corresponding attenuation unit 31/32/33. When a certain attenuation unit 31/32/33 is not adopted to attenuate the RF signal, the unit selection switch M31/M32/M33 may be controlled to connect, so that the RF signal is transmitted to the subsequent circuit through the unit selection switch M31/M32/M33 without being attenuated by the attenuation unit 31/32/33.

The attenuation selection switch M34 refers to a switch arranged in parallel with the series attenuation circuit, and is used to determine whether the series attenuation circuit is needed to attenuate the RF signal. For example, when the series attenuation circuit is adopted to attenuate the RF signal, the attenuation selection switch M34 may be controlled to disconnect, so that the RF signal is attenuated by the series attenuation circuit. When it is not necessary to attenuate the RF signal using the series attenuation circuit, the attenuation selection switch M34 may be controlled to connect, so that the RF signal may be directly transmitted to the signal output end Vout through the attenuation selection switch M34 without being attenuated through by the series attenuation circuit.

Understandably, according to the actual demand, the connection and disconnection of the attenuation selection switch M34 and at least two unit selection switches M31/M32/M33 may be controlled in combination, so as to attenuate the RF signal to different degrees to meet the actual demand, and the circuit structure is simple and the cost is low.

In an embodiment, as shown in FIG. 6, the attenuation unit 31/32/33 includes a a-type attenuation network, a first selection switch connected to the input end of the a-type attenuation network, and a second selection switch connected to the output end of the a-type attenuation network.

In this example, the attenuation unit 31/32/33 adopts the a-type attenuation network for attenuation, which has the advantages of low cost and simple structure, and is used to attenuate RF signals to achieve the effect of gain regulation. Understandably, the attenuation unit 31/32/33 also includes a first selection switch connected to the input end of the a-type attenuation network and a second selection switch connected to the output end of the a-type attenuation network. That is, two selection switches are respectively connected at both ends of the a-type attenuation network, so that RF signals may be input to the a-type attenuation network via the first selection switch and the second selection switch for attenuation processing, thus ensuring the attenuation effect, and the signal attenuation degree may be adjusted according to actual needs.

For example, when the unit selection switches M31 and M33 are connected and the unit selection switch M32 is disconnected, the attenuation unit 32 needs to be used for attenuation. In this state, the first selection switch and the second selection switch in the two attenuation units 31/33 adjacent to the attenuation unit 32 need to be disconnected, so as to avoid the signal from flowing into the two adjacent attenuation units 31/33.

As an example, the a-type attenuation network includes a series resistor, a first parallel resistor and a second parallel resistor. The series resistor is arranged between the first selection switch and the second selection switch. One end of the first parallel resistor is connected with the connection node between the first selection switch and the series resistor, and another end is connected with the ground. One end of the second parallel resistor is connected to the connection node between the series resistor and the second selector switch, and another end is connected to the ground. In this example, the series resistor, the first parallel resistor and the second parallel resistor are arranged in a a-shaped structure, which is simple in structure and low in cost, and can attenuate RF signals and have the effects of filtering and impedance matching.

In an embodiment, selection switches such as unit selection switches M31/M32/M33, attenuation selection switch M34, first selection switch and second selection switch all include a signal control end, a first end and a second end. And the signal control end is connected with a resistor to prevent signals from leaking to the control end of attenuation selection switch M34.

As an example, selection switches such as unit selection switches M31/M32/M33, attenuation selection switch M34, first selection switch and second selection switch may a triode, the signal control end is the base of the triode, the first end is the collector of the triode, and the second end is the emitter of the triode. Triode may be selected as the selection switch according to actual requirements.

As another example, selection switches such as unit selection switches M31/M32/M33, attenuation selection switch M34, first selection switch and second selection switch may be MOS transistors, the signal control end is the gate of the MOS transistor, the first end is the drain of the MOS transistor, and the second end is the source of the MOS transistor. The MOS transistor may be selected as the selection switch according to actual needs.

The above embodiments are only used to illustrate the technical solution of the present application, rather than limit it. Although the application has been described in detail with reference to the foregoing embodiments, it should be understood by those skilled in the art that it is still possible to modify the technical solutions described in the foregoing embodiments, or equivalently replace some technical features thereof. These modifications and equivalents do not make the nature of the corresponding technical solution deviates from the spirit and scope of the present application, and shall be included in the protection scope of the present application.

What is claimed is:

1. A low noise amplification circuit, comprising a RF amplification circuit, an output impedance matching circuit, an attenuation network, a passive attenuation path and an impedance regulation network;

one end of the RF amplification circuit is connected with a signal input end, and another end is connected with the output impedance matching circuit;

one end of the output impedance matching circuit is connected with the RF amplification circuit, and another end is connected with the attenuation network;

one end of the attenuation network is connected with the output impedance matching circuit, and another end is connected with a signal output end;

one end of the passive attenuation path is connected with the signal input end, and another end is connected with a connection node between the output impedance matching circuit and the attenuation network; and the impedance regulation network is configured to, in a first working mode, resonate with a parasitic capacitance generated by the attenuation network, in a second working mode, resonate with a parasitic capacitance generated by the attenuation network and the passive attenuation path, so as to realize impedance matching; and one end of the impedance regulation network is connected with the passive attenuation path and the connection node between the output impedance matching circuit and the attenuation network, and another end is connected with a ground.

2. The low noise amplification circuit of claim 1, wherein one end of the passive attenuation path is connected with the signal input end via a first DC blocking capacitor, and another end is connected with the connection node between the output impedance matching circuit and the attenuation network via a second DC blocking capacitor; and one end of the impedance regulation network is connected with a connection node between the passive attenuation path and the second DC blocking capacitor, and another end is connected with the ground.

3. The low noise amplification circuit of claim 2, wherein the impedance regulation network is an inductance regulation network.

4. The low noise amplification circuit of claim 3, wherein the inductance regulation network comprises a first regulation inductor, a second regulation inductor, a first regulation switch and a second regulation switch;

one end of the first regulation inductor is connected with the passive attenuation path and the second DC blocking capacitor, and another end is connected with the second regulation inductor;

one end of the second regulation inductor is connected with the first regulation inductor, and another end is connected with the ground via the second regulation switch; and one end of the first regulation switch is connected to a connection node between the first regulation inductor and the second regulation inductor, and another end is connected to the ground.

5. The low noise amplification circuit of claim 3, wherein the inductance regulation network comprises the first regulation inductor and a first adjustable capacitor arranged in parallel;

one end of the first regulation inductor is connected with the passive attenuation path and the second DC blocking capacitor, and another end is connected with the ground; and one end of the first adjustable capacitor is connected to a connecting path of the passive attenuation path and the first regulation inductor, and another end is connected to the ground.

6. A low noise amplification circuit, comprising a RF amplification circuit, an output impedance matching circuit, an attenuation network, a passive attenuation path and an impedance regulation network;

one end of the RF amplification circuit is connected with a signal input end, and another end is connected with the output impedance matching circuit;

one end of the output impedance matching circuit is connected with the RF amplification circuit, and another end is connected with the attenuation network;

one end of the attenuation network is connected with the output impedance matching circuit, and another end is connected with a signal output end;

one end of the passive attenuation path is connected with the signal input end, and another end is connected with a connection node between the output impedance matching circuit and the attenuation network; and the impedance regulation network is configured to, in a first working mode, resonate with a parasitic capacitance generated by the attenuation network, in a second working mode, resonate with a parasitic capacitance generated by the attenuation network and the passive attenuation path, so as to realize impedance matching;

wherein the output impedance matching circuit comprises an adjustable capacitance unit and an impedance matching unit;

one end of the adjustable capacitance unit is connected with the RF amplification circuit, and another end is connected with the attenuation circuit; and one end of the impedance matching unit is connected with a power supply, and another end is connected with a connection node between the RF amplification circuit and the adjustable capacitance unit.

7. The low noise amplification circuit of claim 6, wherein the adjustable capacitance unit comprises at least two capacitance adjustment branches arranged in parallel between the RF amplification circuit and the attenuation network;

each capacitance adjustment branch comprises a capacitance selection switch and a to-be-selected adjustable capacitance, wherein a first end of the capacitance selection switch is connected with the RF amplification circuit as an input end of the adjustable capacitance unit, a second end of the capacitance selection switch is connected with a first end of the to-be-selected adjustable capacitance, and a second end of the to-be-selected adjustable capacitance is connected with the attenuation network as an output end of the adjustable capacitance unit.

8. The low noise amplification circuit of claim 6, wherein the output impedance matching circuit comprises a matching inductor and a matching resistor;

one end of the matching inductor is connected with the power supply, and another end is connected with the connection node between the RF amplification circuit and the adjustable capacitance unit; and one end of the matching resistor is connected with the power supply, and another end is connected with the connection node between the RF amplification circuit and the adjustable capacitance unit.

9. The low noise amplification circuit of claim 1, wherein the passive attenuation path comprises at least two disconnectors connected in series;

each disconnector comprises a signal control end, a first end and a second end, the first end and the second end of two adjacent disconnectors are connected, the first end of a first disconnector is connected with the signal input end, and the second end of a last disconnector is connected with the impedance regulation network and the second DC blocking capacitor.

10. A low noise amplification circuit, comprising a RF amplification circuit, an output impedance matching circuit, an attenuation network, a passive attenuation path and an impedance regulation network;

one end of the RF amplification circuit is connected with a signal input end, and another end is connected with the output impedance matching circuit;

one end of the output impedance matching circuit is connected with the RF amplification circuit, and another end is connected with the attenuation network;

one end of the attenuation network is connected with the output impedance matching circuit, and another end is connected with a signal output end;

one end of the passive attenuation path is connected with the signal input end, and another end is connected with a connection node between the output impedance matching circuit and the attenuation network; and the impedance regulation network is configured to, in a first working mode, resonate with a parasitic capacitance generated by the attenuation network, in a second working mode, resonate with a parasitic capacitance generated by the attenuation network and the passive attenuation path, so as to realize impedance matching:

wherein the attenuation network comprises at least two attenuation units, at least two unit selection switches and one attenuation selection switch; the at least two attenuation units are arranged in series between the output impedance matching circuit and the signal output end to form a series attenuation circuit; each unit selection switch is connected in parallel with one attenuation unit; and the attenuation selection switch is connected in parallel with the series attenuation circuit.

* * * * *